(12) United States Patent
Igusa et al.

(10) Patent No.: US 6,782,520 B1
(45) Date of Patent: Aug. 24, 2004

(54) IC LAYOUT SYSTEM HAVING SEPARATE TRIAL AND DETAILED ROUTING PHASES

(75) Inventors: Mitsuru Igusa, Los Gatos, CA (US); Shiu-Ping Chao, Los Altos Hills, CA (US); Wei-Jin Dai, Cupertino, CA (US); Dennis Huang, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 49 days.

(21) Appl. No.: 10/217,851

(22) Filed: Aug. 12, 2002

Related U.S. Application Data

(60) Provisional application No. 60/312,221, filed on Aug. 13, 2001.

(51) Int. Cl.[7] .......................... G06F 17/50; G06F 9/45; G06F 9/455
(52) U.S. Cl. .............................. 716/9; 716/10; 716/11; 716/12; 716/13
(58) Field of Search ........................................ 716/7–14

(56) References Cited

U.S. PATENT DOCUMENTS

| | | | |
|---|---|---|---|
| 5,856,927 A | * | 1/1999 | Greidinger et al. ........... 716/12 |
| 6,230,304 B1 | * | 5/2001 | Groeneveld et al. ........... 716/7 |
| 6,292,928 B1 | * | 9/2001 | Yamaguchi et al. .......... 713/13 |
| 6,484,298 B1 | * | 11/2002 | Nag et al. ...................... 716/6 |
| 6,519,749 B1 | * | 2/2003 | Chao et al. .................... 716/9 |
| 6,557,145 B2 | * | 4/2003 | Boyle et al. ................... 716/2 |
| 6,651,232 B1 | * | 11/2003 | Pileggi et al. ................. 716/7 |

* cited by examiner

*Primary Examiner*—Leigh M. Garbowski
*Assistant Examiner*—Paul Dinh
(74) *Attorney, Agent, or Firm*—Daniel J. Bedell; Smith-Hill and Bedell

(57) ABSTRACT

An integrated circuit (IC) layout process is organized into two phases. During the Phase 1 of the process, a preliminary placement plan is generated fixing the position of every cell of an IC design described by a gate level netlist. A trial routing plan is also generated establishing approximate routes of the nets that are to interconnect cell terminals. The placement plan and the trial routing plan are then iteratively analyzed and modified as necessary to ensure that the layout meets various signal path timing, signal integrity, and power distribution and other constraints. Thereafter, at the start of Phase 2 of the layout process, the trial routing plan is converted into a detailed routing plan specifying in detail the exact routes to be followed by all nets. The placement plan and detailed routing plan are then iteratively analyzed and modified as necessary to ensure that they meet all design constraints.

21 Claims, 3 Drawing Sheets

IC LAYOUT SYSTEM HAVING SEPARATE TRIAL AND DETAILED ROUTING PHASES

CROSS-REFERENCE TO RELATED APPLICATIONS

The present application claims benefit of the filing date of U.S. Provisional Application No. 60/312,221, filed Aug. 13, 2001.

BACKGROUND OF THE INVENTION

1. Field of the Invention

The present invention relates to computer software for automatically generating an integrated circuit layout.

2. Description of Related Art

FIG. 1 illustrates a typical integrated circuit (IC) design process flow. An IC designer usually begins the IC design process by producing a register transfer language (RTL) "netlist" 10 describing the IC circuit as a set of nets (signal paths) interconnecting terminals of circuit devices. In a high level RTL netlist circuit devices may be described in terms of the logic they carry out using Boolean expressions to define logical relationships between device input and output signals. After employing circuit simulation and verification tools 11 to check the logic of the IC described by RTL level netlist 10, the designer uses a syntheses tool 12 to convert RTL level netlist 10 into a "gate level" netlist 14 describing the IC as a collection of cells having terminals interconnected through the nets. A "cell" is a circuit component described by a cell library 13 containing an entry for each cell that may be incorporated into an IC design. The library entry for each cell describes the cell's layout. Cells may range from very small device such as individual transistors, to small components such as logic gate formed by several transistors, up to very large components such as computer processors and memories. Gate level netlist 14 incorporates each cell into the IC design by referring to an entry in cell library 13 describing the cell.

The entry for each cell in cell library 13 also provides a model of the time-dependent behavior of the cell that represent the cell when gate level netlist 14 is subjected to simulation and verification 11. A simulation based on gate level netlist 14 more accurately predicts the behavior of the IC than a simulation based on RTL level netlist 10. However since the gate level netlist 14 does not model the signal routing paths between the cells, the simulation and verification results at this stage of the design do not take into account signal path delays between the cells.

After verifying the behavior of the circuit described by gate level netlist 14, the circuit designer employs computer-aided placement and routing (P&R) tools 16 to convert gate level netlist 14 into an IC layout describing how each cell is to be formed and positioned within a semiconductor substrate and describing the signal routing paths within the IC that are to interconnect the cells. Cell library 13 tells P&R tools 16 how to lay out each cell, and the P&R tools determine where to place each cell in the substrate and how to route signal paths between them.

As P&R tools 16 create an IC layout, a "netlist updater" 20 updates the gate level netlist 14 to produce a "layout level" netlist 22 modeling not only the cells forming the IC but also the routing structures that interconnect the cells. After P&R tools 16 have produced a layout 18, the designer may then again use simulation and verification tools 11 to verify the behavior of the circuit based on the more accurate layout level netlist 22 before sending the completed IC layout 18 to an IC manufacturer. Should layout 18 fails to satisfy all design constraints, the designer may try to resolve problems by using P&R tools 16 to alter layout 18. If that approach fails, the designer may try altering gate level netlist 14 and then repeating the placement and routing process.

Placement and Routing Tools

FIG. 2 illustrates a typical example of an iterative placement and routing process carried out at step 15 of FIG. 1. The designer may initially create a floor plan (step 24) for the layout when particular areas of the semiconductor substrate are to be reserved for particular cells. A P&R tool then develops a placement plan (step 26) indicating where each cell referenced by gate level netlist 14 is to be placed and how it is to be oriented within a semiconductor substrate in a manner consistent with the floor plan. Thereafter the P&R tool develops a routing plan (step 28) describing the routing structures that implement the nets interconnecting cell terminals. The placement and routing process (steps 26 and 28) is iterative in that when the P&R tool is unable to develop a routing plan a step 28 providing a suitable route for every net of the design, it alters the placement plan at (step 26) to reposition the cells, and then attempts to develop a suitable routing plan for the altered placement plan at step 28.

Within most digital ICs, signals pass between blocks of logic through clocked devices such as registers and flip-flops so that the clock signals clocking those devices can synchronize the timing with which the logic blocks pass signals to one another. The logic blocks are therefore subject to timing constraints in that they must be able to process their input signals to produce their output signals within the period between edges of the clock signal that clock their input and output signals. The time required for a logic block to process its input signals is a function of the processing speed of each cell within the logic block involved in the signal processing, and is also a function of the signal path delays through the various routing structures interconnecting those cells. Although the placement and routing tools may find space in the layout for all cells and for all of the routing structures interconnecting them at steps 26 and 28, the path delays through some of the logic blocks may fail to meet timing constraints.

Thus after the P&R tools have established placement and routing plans at steps 26 and 28, it is necessary to verify that all logic block meet their timing constraints. To do so, an RC extraction tool initially processes routing plan (step 30) to determine resistances and capacitances of the various sections of signal paths defined by the routing plan and passes that information to a timing analysis tool. Since the path delay though a conductor is a function of its resistance and capacitance (path inductance is usually neglected) the timing analysis tool (at step 32) is able to compute path delays through the various routing structures based on the resistance and capacitance information provided by the RC extraction tool. The timing analysis tool also consults the cell library to determine the path delay through each cell of interest. Based on the information provided by timing analysis tool, the placement and routing plans are subjected to an "in place optimization" process (step 34) in which the path delays through the various logic blocks are analyzed to determine whether they meet their timing constraints. When a logic block fails to meet a timing constraint, the placement plan can be incrementally modified (step 35) by inserting buffers in signal paths to reduce path delays or by moving cells of the logic block closer together to reduce path delays between the cells. The routing plan is then altered (step 28) a necessary to accommodate the altered placement plan. The RC extraction (step 30) and timing analysis processes (step 32) are also repeated. The process iterates through steps 28, 30, 32, 34 and 35 until placement and routing plans satisfying all timing constraints are established.

The layout process may also include a step of checking the layout for various signal integrity problems (step 36) including, for example, static timing analysis and cross-talk analysis, and iteratively modifying the placement and routing plans (step 35) to resolve these problems.

When all signal integrity problems are resolved, a clock tree synthesis tool designs one or more clock trees (step 37) for the IC. A clock tree is a network of buffers for distributing a clock signal to the various registers, flip-flops and other clocked circuit devices. The clock tree design indicates an approximate position of each buffer forming the clock tree and routing paths interconnecting the buffers that will ensure that each clock signal edge arrives all clocked devices at substantially the same time. After the clock tree has been designed, the placement and routing plans are modified (steps 35 and 28) as necessary to fix the positions of the buffers forming the clock tree and the signal paths interconnecting them. The timing analysis and in-place optimization steps 32 and 34 may then be repeated to verify that the change in placement and routing needed to accommodate the clock tree has not adversely affected the ability of the IC layout to meet all timing constraints. If, so steps 35, 28, 30, and 34 are repeated as necessary to adjust the layout to meet its timing constraints. A power analysis step 39 is also be carried out in which the layout is analyzed to determine whether the power loads are adequately distributed throughout the power distribution network that delivers power to all cells. When the layout process is unable to produce a layout based on gate level netlist 14 that satisfies all constraints, it may be necessary at step 40 to restructure the logic of the IC design (i.e. to modify gate level netlist 14) and then repeat the entire placement and routing process.

The IC layout process illustrated in FIG. 2 can be very time-consuming, particularly for large, tightly constrained IC designs. Routing step 28 consumes much of the processing time because developing and modifying a routing plan is computationally expensive and because routing step 28 must be revisited many times during the iterative layout process following iterative modifications to the placement plan as a result of steps 34, 36, 37, 39 and 40.

What is needed is an improved layout process flow that reduces the amount of time spent on developing and modifying the routing plan.

BRIEF SUMMARY OF THE INVENTION

In accordance with the invention an integrated circuit (IC) layout process is organized into two phases. During the Phase 1 of the process, a preliminary placement plan is developed fixing the position of every cell of an IC design described by a gate level netlist. A trial routing plan is then developed establishing approximate routes of the nets that are to interconnect cell terminals. The placement plan and the trial routing plan are then iteratively analyzed and modified as necessary to ensure that the layout meets all defined signal path timing, signal integrity, and power distribution and other constraints.

Thereafter, at the start of Phase 2 of the layout process, the trial routing plan is converted into a detailed routing plan specifying in detail the routes followed all nets. The placement plan and detailed routing plan are then iteratively analyzed and modified as necessary to ensure that they meet all design constraints.

The invention speeds up the layout process by delaying the need to create and update a detailed routing plan until Phase 2 of the process. During Phase 1 of the process, a routing tool can create and iterative modify the trial layout very quickly because it is necessary for the routing tool to terminate the nets in the vicinity of the cell terminals to which they are to be connected and not exactly on them, and it is not necessary for the routing tool to spend time looking for and correcting routing conflicts. However, although the trial routing plan only approximates net routes, it nonetheless provides a basis for estimating signal path delays with sufficient accuracy to permit the various constraint checking tools to determine whether the layout is likely to meet all timing constraints when the trial routing plan is converted to a detailed routing plan at the start of Phase 2 of the process. Thus when the layout process enters Phase 2 and converts the trial routing plan to a detailed routing plan, it normally requires only a relatively few iterative modifications to the placement plan and the detailed routing plans to produce a layout meeting all constraints. The total time required to carry out both Phase 1 and Phase 2 of the placement and routing process will typically be substantially less then the time need to carry out a prior art process which initially creates and iteratively updates a detailed routing plan. The two-phase process flow in accordance with the invention provides a particularly large speed advantage over the conventional approach when used to lay out a large, tightly constrained IC requiring many iterative placement and routing plan modifications to satisfy all design constraints.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION THE INVENTION

The present invention is directed to a process for designing the layout of an integrated circuit (IC) layout based on gate level netlist description of the IC, to computer readable media storing software which when read and executed by ore or more conventional computers causes the computer(s) to carry out the process, and to an apparatus formed by the computer(s) when programmed to carry out the process. Suitable computer-readable media for storing software include, but are not limited to, compact disks, floppy disks, hard disks, and random access or read only memory. While the specification describes an exemplary embodiment of the invention considered to be a best mode of practicing the invention, it is not intended that the invention be limited to that exemplary embodiment.

Figure 1:
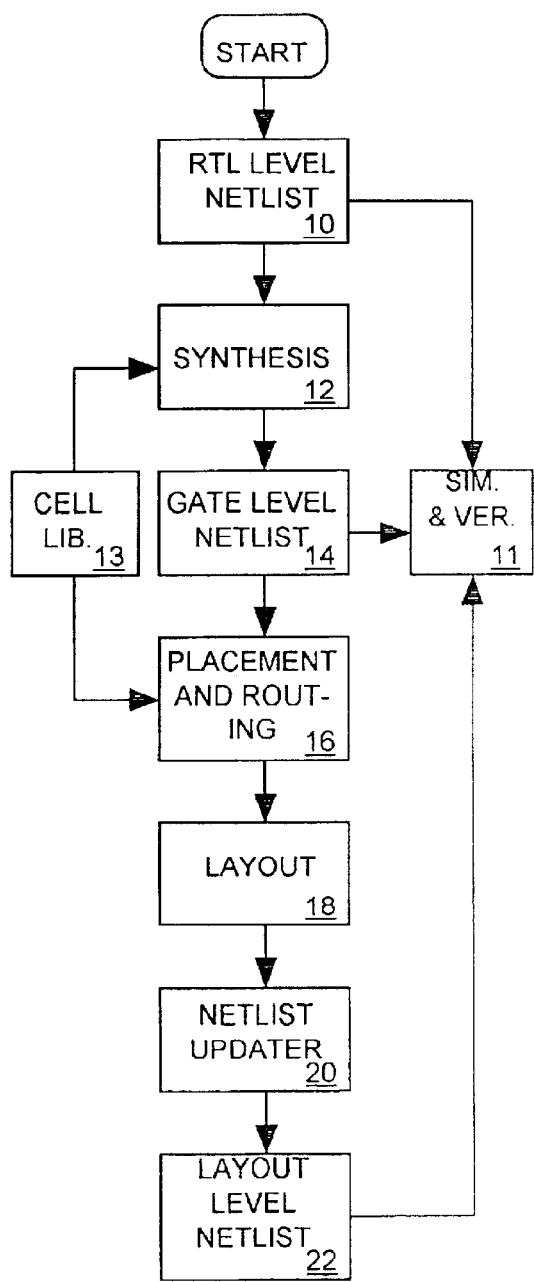
FIG. 1 is a flow diagram illustrating a typical prior art integrated circuit design process.

FIG. 1 illustrates a placement and routing system in accordance with the invention for processing a gate level netlist description of an integrated circuit (IC) to produce a detailed layout of the IC including placement and routing plans indicating where each cell forming the IC is to be positioned within an IC substrate and describing the routing structures that are to interconnect the cells. In accordance with the invention, the system uses a two-phase process for developing the layout. Steps 50–68 are executed during the first phase of the process while steps 70–88 are executed during the second phase of the process.

At the start of Phase 1 of the process a floor plan and a power plan are developed (steps 50 and 52) to allocate IC floor space and power to the various portions of the IC. A detailed placement plan is then produced (step 54) assigning all cells of the IC to positions within the substrate in a manner consistent with the floor plan. If a satisfactory placement plan cannot be developed at step 54 based on the floor plan produced at step 10, then the process returns to step 50 to generate a new floor plan.

When a satisfactory detailed placement plan is produced at step 54, the plan is modified as necessary to optimize the placement of scan registers, if any (step 56). Scan registers are shift registers connected in series by a scan bus for shifting data into and out of the IC. The optimization process at step 56 helps to position the scan registers to reduce the amount of space needed to route the scan bus between the scan registers.

A routing tool then produces a trial routing plan (step 58) describing routes for all nets interconnecting cell terminals. Typically a conventional routing tool produces a detailed routing plan by initially creating a trial routing plan specifying an approximate route each net follows between cell terminals and then iteratively modifying the trial plan as necessary to make sure that each net terminates at the right points on the cells it interconnects, to eliminate any conflicts between nets, and to eliminate any design rule violations. A conventional routing tool can create an initial trial routing plan quickly but requires much time to convert a trial routing plan into a detailed routing plan. Therefore, in accordance with the present invention, during Phase 1 of the design process, the routing tool does not take the routing plan beyond the trial plan stage. The routing tool does need not make sure every net terminates at exactly in the right point on each cell, does not discover and resolve routing conflicts, and does not ensure that the trial routing plan satisfies all design rules and constraints. However the routing of each net specified by the trial routing plan will normally be a sufficiently good approximation of the routing of the net as it will appear in the detailed routing plan developed later (in Phase 2) to provide a basis for a reasonably accurate estimate of the signal path delays between the cells.

Thus after the trial routing plan is developed at step 58, a conventional RC extraction tool processes the trial routing plan to determine resistances and capacitances distributed along the various sections of the nets (step 60) and a conventional path delay and timing analysis tool uses that information to determine path delays within the IC (step 61). A clock tree syntheses tool then (step 62) processes the layout to design one or more clock trees, networks of buffers for routing clock signals to various cells devices. The placement plan is incrementally modified at steps 68 as necessary to place buffers forming the clock tree, and the trial routing plan is quickly adjusted at step 58 to incorporate the nets interconnecting the clock tree buffers.

At step 63, an "in place optimization" tool checks various signal paths between clocked registers within the IC to determine whether they meet specified timing constraints and develops a buffer insertion plan indicating sizes and positions of buffers to be inserted in various nets when necessary to reduce their path delays. The placement and trial routing plans are incrementally modified at steps 68 and 58 in accordance with the buffer insertion plan to show wherein the buffers are placed and how they are interconnected.

At steps 64 and 65 the layout is checked to determine whether it must be restructured to-satisfy various design rules or to preserve signal integrity. The power requirements of the various areas of the layout are also analyzed at step 66 to determine whether they are within limits established by the power plan developed at step 52. When any of steps 64–66 determine that the detailed placement and trial routing plans must be modified, the placement plan is incrementally modified (step 68) and the trial routing plan updated (step 58) to accommodate with placement plan modification.

Thus Phase 1 of the layout process produces a detailed placement plan and a trial routing plan, the plans having been incrementally modified at steps 68 and 58 to accommodate clock trees and to satisfy various timing and other constraints on the IC layout. Since during Phase 1 of the process the routing tool need only produce and update a trial routing plan that need only approximate net routing and need not satisfy all routing criteria, it can update the trial routing plan quickly with each iterative pass through step 58.

When Phase 1 of the process is complete and satisfies all constraints imposed at steps 61–66, the power plan, detailed placement plan and trial routing plans generated during the first stage are provided as "seed plans" for Phase 2 of the placement and routing process. The seed power plan is converted into a detailed power routing plan (at step 70) indicating how power signals are to be routed within the substrate. The trial routing plan developed during Phase 1 is converted into a detailed routing plan (step 72) which accurately routes each net between cell terminals, avoids conflicts between nets and meets routing constraints. In creating the detailed routing plan at step 72 it may be necessary to iteratively modify the placement plan (step 71) in order to permit detailed routing of all nets.

Once the detailed routing plan has been created at step 72, a set of analysis, optimization and synthesis steps 80–86 similar to steps 60–66 of Phase 1 are carried out to check the placement and detailed routing plans and to determine to update the detailed placement and routing plans at steps 88 and 72 to ensure that they meet all constraints. An RC extraction step 80 processes the detailed routing plan to determine the resistances and capacitances of the various net section from which path delays of various net sections are calculated at step 81. The clock tree design developed at step 62 of Phase 1 and the buffer insertion plan developed at step 63 of Phase 1 are updated at steps 82 and 83 when necessary to accommodate any changes in path delays resulting from differences between the routing of any net specified by the detailed routing plan and the routing of that net specified by the trial routing plan. The detailed placement and routing plans are also reviewed at steps 84–86 to verify that they satisfy the various logic and signal integrity and power distribution criteria. When necessary to meet that criteria, the detailed placement and routing plans are incrementally modified at steps 88 and 72.

Since the routing tool carrying out step 72 must update a detailed routing plan, each iterative pass through step 72 of Phase 2 typically proceeds much more slowly than an iterative pass through the corresponding step 58 of Phase 1 in which the routing tool need only update a trial routing plan. As mentioned above, it is faster for a routing tool to update a trial routing plan because it need not determine the exact path each net must follow and need not correct for routing conflicts. However since Phase 2 of the process begins with placement and trial routing plans that were previously adjusted during Phase 1 to satisfy the various design criteria, in most cases only a relatively few passes through step 72 will be needed for the system to correct for any change in the ability to meet design criteria that may have arisen due to the conversion of the trial routing plan to a detailed routing plan.

Figure 2:
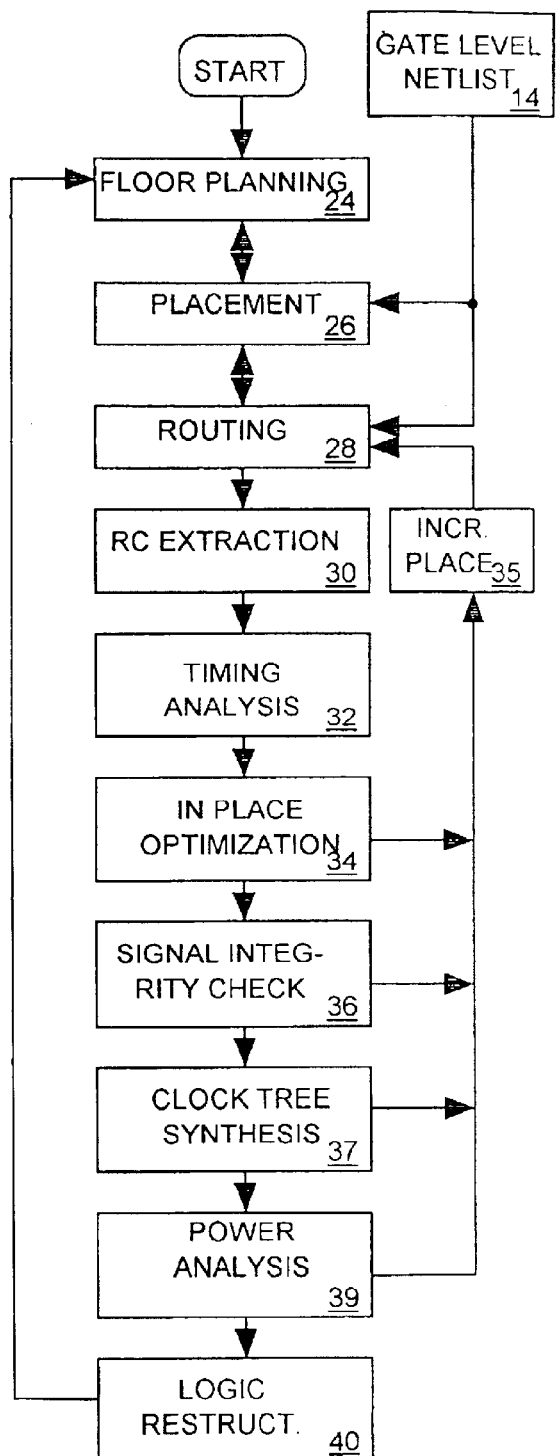
FIG. 2 is a flow diagram illustrating a typical prior art placement and routing process.

The total time required to carry out both Phase 1 and Phase 2 of the placement and routing process will typically be substantially less than the time needed to carry out a prior art "single phase" process which only creates and iteratively modifies only a detailed routing plan. In particular, the two-phase process flow of FIG. 2 provides a substantial processing speed advantage over the conventional single phase approach when used to lay out a large, tightly constrained IC requiring many iterative placement and routing plan modifications to satisfy all design constraints.

Figure 3:
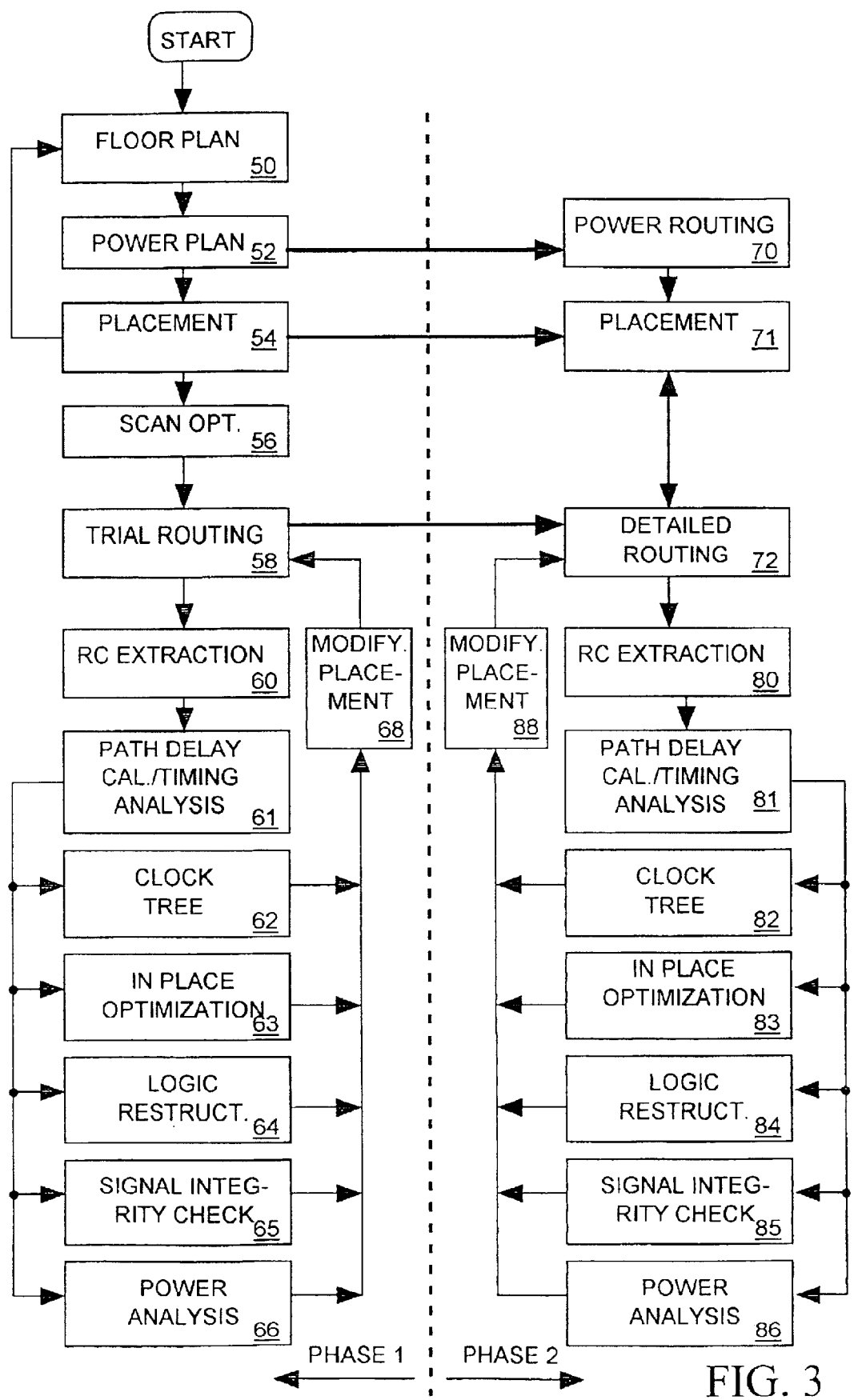
FIG. 3 is a flow diagram illustrating a placement and routing process in accordance with the invention.
Figure 4:
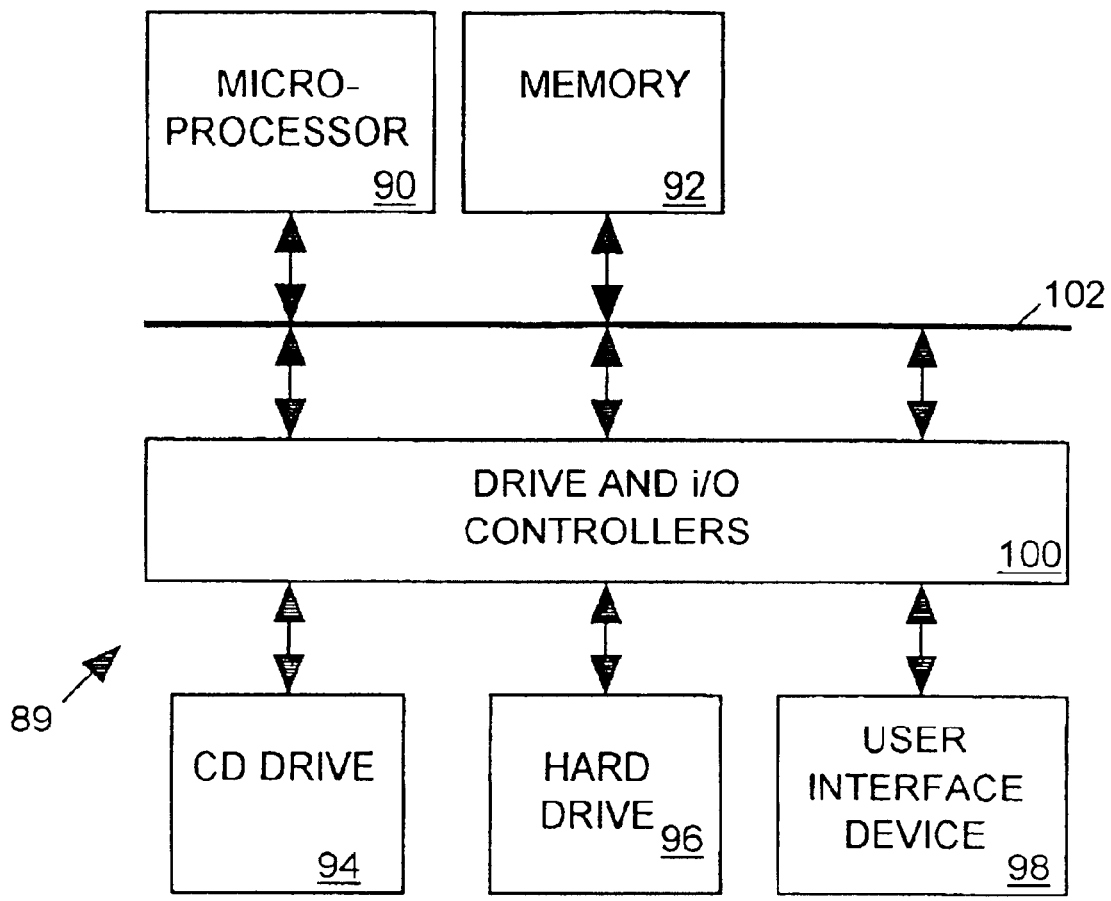
FIG. 4 is a block diagram of a computer programmed to carry out the placement and routing process of FIG. 3.

FIG. 4 illustrates in block diagram form a computer 89 including a microprocessor 90, memory 92, a compact disk drive 94, a hard drive 96, user interface devices communicating though drive and I/O controllers 100 and a computer bus 102. In accordance with the invention one or more computers 89 is adapted to carry out the above-described method for layout out an IC when programmed to carry out the method steps illustrated in FIG. 3 by software stored on computer readable media accessed by processor 90 including, for example, a compact disc inserted into CD drive 94, a disc within hard drive 92, and memory 92. Those of skill in the art will appreciate that other computer architectures may be employed and that the software may be provided on other types of computer readable media and that the computer may access the computer readable media via computer network.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that equivalents of the example elements or steps embodiments) of the invention depicted in and drawings.

What is claimed is:

1. A method for designing a layout for an integrated circuit (IC) comprising cells having terminals interconnected by nets, wherein the layout includes a placement plan and a routing plan, wherein the placement plan specifies where each cell in to be placed in a semiconductor substrate, and wherein the routing plan specifies in detail a route each net is to follow between the cell terminals it is to interconnect, the method comprising the steps of:

a. generating a placement plan for the IC specifying a position within the semiconductor substrate for each of the cells, b. generating a trial routing plan specifying an approximate route each net is to follow, c. iteratively modifying the placement plan generated at step a and the trial routing plan generated at step b to reposition at least one cell, to reroute at least one net, and to insert at least one additional buffer into at least one of the nets, until the placement and routing plans satisfy first constraints, including constraints on signal path delays through the nets, d. converting the trial routing plan iteratively modified at step c into a detailed routing plan specifying a detailed route each net is to follow between the cell terminals it interconnects, and e. iteratively modifying the placement plan and the detailed routing plan until they satisfy second constraints.

2. The method in accordance with claim 1 wherein the second constraints are more restrictive with respect to net routing than the first constraints.

3. The method in accordance with claim 2 wherein the second constraints constrain net routing such that all nets terminate on the cell terminals they are to interconnect and wherein the first constraints constraint net routing such that all nets terminate only proximate to the cell terminals they are to interconnect.

4. The method in accordance with claim 2 wherein the second constraints constrain net routing to avoid net routing conflicts and wherein the first constraints permit net routing conflicts.

5. The method in accordance with claim 1 wherein step c comprises the substeps of:

c1. processing the trial routing plan to estimate signal path delays within the nets, c2. developing a buffer insertion plan specifying at least one buffer to be inserted into at least one of the nets to alter its estimated signal path delay to satisfy at least one of the first constraints, c3. modifying the placement plan so that it specifies a position within the semiconductor substrate for the at least one buffer specified by the buffer insertion plan, and c4. modifying the trial routing plan to modify the routing of the least one net to accommodate routing of the at least one net to the at least one buffer.

6. The method in accordance with claim 5 wherein step e comprises the substeps of:

e1. processing the detailed routing plan to estimate signal path delays within the nets, e2. modifying the buffer insertion plan to alter an estimated signal path delay within at least one of the nets to satisfy at least one of the second constraints, e3. modifying the placement plan in response to the modification to the buffer insertion plan at step e2, and e4. modifying the trial routing plan in response to the modification of the placement plan at step e2.

7. The method in accordance with claim 1 further comprising the step of:

f. between steps b and d, generating a clock tree design for a clock tree to be included in the IC for delivering a clock signal to various ones of the cells, wherein the clock tree includes buffers interconnected by nets;

g. between steps f and d, modifying the placement plan so that it specifies a position within the semiconductor substrate of each buffer of the clock tree, and modifying the trial placement plan so that it specifies approximate routing of the nets interconnecting the buffers;

h. following step d, altering the clock tree design; and i. modifying the placement plan and the detailed routing plan to adjust specification of buffer placement and net routing in accordance with changes to the clock tree design made at step f.

8. Computer readable media storing software which when executed by a computer causes the computer to carry out a method for designing a layout for an integrated circuit (IC)

comprising cells having terminals interconnected by nets, wherein the layout includes a placement plan and a routing plan, wherein the placement plan specifies a position of each cell within in a semiconductor substrate, and wherein the routing plan specifies routing of the nets between terminals of the cells, the method comprising the steps of:

a. a generating a placement plan for the IC specifying a position within the semiconductor substrate for each of the cells, b. generating a trial routing plan specifying an approximate routing of each net, c. modifying the placement plan and trial routing plan that to reposition at least one cell to reroute at least one net and to insert at least one additional buffer into at least one of the nets, so that the placement and routing plans satisfy first constraints, including constraints on signal path delays through the nets, d. converting the trial routing plan into a detailed routing plan specifying a detailed routing of each net, and e. modifying the placement plan and the detailed routing plan so that they satisfy second constraints.

9. The computer readable media in accordance with claim 8 wherein the second constraints are more restrictive with respect to net routing than the first constraints.

10. The computer readable media in accordance with claim 9 wherein the second constraints specify that all nets are to terminate on cell terminals and wherein the first constraints permit all nets are to terminate other than on cell terminals.

11. The computer readable media in accordance with claim 9 wherein the second constraints constrain net routing to avoid net routing conflicts and wherein the first constraints permit net routing conflicts.

12. The computer readable media in accordance with claim 8 wherein step c comprises the substeps of:

c1. processing the trial routing plan to estimate signal path delays within the nets, c2. generating a buffer insertion plan specifying buffers to be inserted into at least one of the nets to alter its estimated signal path delay in satisfaction of at least one of the first constraints, c3. modifying the placement plan so that it specifies a position for each of the specified buffers within the semiconductor substrate, and c4. modifying the trial routing plan to alter the specified routing of said at least one of the nets.

13. The computer readable media in accordance with claim 12 wherein step e comprises the substeps of:

e1. processing the detailed routing plan to estimate signal path delays within the nets, e2. modifying the buffer insertion plan to alter an estimated signal path delay within at least one of the nets in satisfaction of at least one of the second constraints, e3. modifying the placement plan in response to the modification to the buffer insertion plan at step e2; and e4. modifying the trial routing plan in response to the modification of the placement plan at step e2.

14. The computer readable media in accordance with claim a further comprising the step of:

f. between steps b and d, generating a clock tree design for a clock tree to be included in the IC for delivering a clock signal to various ones of the cells, the clock tree including set of buffers interconnected by nets;

g. between steps f and d, modifying the placement plan to specify a position within the semiconductor substrate of each buffer of the clock tree and modifying the trial placement plan so that it specifies approximate routing of the nets interconnecting the buffers;

h. following step d, modifying the clock tree design; and i. modifying the placement plan and the detailed routing plan to render them consistent with changes to the clock tree design made at step f.

15. An apparatus for designing a layout for an integrated circuit (IC) comprising cells having terminals interconnected by nets, wherein the layout includes a placement plan and a routing plan, wherein the placement plan specifies a position of each cell within a semiconductor substrate, and wherein the routing plan specifies routing of the nets between terminals of the cells they interconnect, the apparatus comprising:

at least one computer, and computer readable-media containing software read accessed and executed by the computer causing the computer to carry out the steps of:

a. generating a placement plan for the IC specifying a position within the semiconductor substrate for each of the cells, b. generating a trial routing plan specifying an approximate route each net is to follow, c. iteratively modifying the placement plan generated at step a and the trial routing plan generated at step b to reposition at least one cell, to reroute at least one net, and to insert at least one additional buffer into at least one of the nets, until the placement and routing plans satisfy first constraints, including constraints on signal path delays through the nets, d. converting the trial routing plan iteratively modified at step c into a detailed routing plan specifying a detailed route each net is to follow between the cell terminals it interconnects, and e. iteratively modifying the placement plan and the detailed routing plan until they satisfy second constraints.

16. The apparatus in accordance with claim 15 wherein the second constraints are more restrictive with respect to net routing than the first constraints.

17. The apparatus in accordance with claim 16 wherein the second constraints specify that all nets are to terminate on cell terminals and wherein the first Constraints require that all nets are to terminate proximate to cell terminals.

18. The apparatus in accordance with claim 16 wherein the second constraints constrain net routing to avoid net routing conflicts and wherein the first constraints permit net routing conflicts.

19. The apparatus in accordance with claim 15 wherein step c comprises the substeps of:

c1. processing the trial routing plan to estimate signal path delays within the nets, c2. generating a buffer insertion plan specifying buffers to be inserted into at least one of the nets to alter its estimated signal path delay in satisfaction or at least one of the first constraints, c3. modifying the placement plan so that it specifies a position for each of the specified buffers within the semiconductor substrate, and c4. modifying the trial routing plan to alter the specified routing of said at least one of the nets.

20. The apparatus in accordance with claim 19 wherein step e comprises the substeps of:

e1. processing the detailed routing plan to estimate signal path delays within the nets, e2. modifying the buffer insertion plan to alter an estimated signal path delay within at least one of the nets in satisfaction of at least one of the second constraints, e3. modifying the placement plan in response to the modification to the buffer insertion plan at step e2, and e4. modifying the trial routing plan in response to the modification of the placement plan at step e2.

21. The apparatus in accordance with claim 15 is further comprising the step of:

f. between steps b and d, generating a clock tree design for a clock tree to be included in the IC for delivering a clock signal to various ones of the cells, the clock tree including set of buffers interconnected by nets;

g. between steps f and d, modifying the placement plan to specify a position within the semiconductor substrate of each buffer of the clock tree and modifying the trial placement plan so that it specifies approximate routing of the nets interconnecting the buffers;

h. following step d, modifying the, clock tree design; and i. modifying the placement plan and the detailed routing plan to render them consistent with changes to the clock tree design made at step f.

* * * * *

UNITED STATES PATENT AND TRADEMARK OFFICE
CERTIFICATE OF CORRECTION

PATENT NO. : 6,782,520 B1
DATED : August 24, 2004
INVENTOR(S) : Mitsuru Igusa et al.

It is certified that error appears in the above-identified patent and that said Letters Patent is hereby corrected as shown below:

Column 9,
Line 7, "a generating" should be deleted and replaced with -- generating --
Line 12, delete "that"
Line 59, "claim a" should be deleted and replaced with -- claim 8 --

Column 10,
Line 44, "Constraints" should be deleted and replaced with -- constraints --

Signed and Sealed this

Eighth Day of February, 2005

JON W. DUDAS
*Director of the United States Patent and Trademark Office*